(12) United States Patent
Yamashita (10) Patent No.: US 6,921,976 B2
(45) Date of Patent: Jul. 26, 2005

(54) SEMICONDUCTOR DEVICE INCLUDING AN ISLAND-LIKE DIELECTRIC MEMBER EMBEDDED IN A CONDUCTIVE PATTERN

(75) Inventor: Tomio Yamashita, Ogaki (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/076,355

(22) Filed: Feb. 19, 2002

(65) Prior Publication Data

US 2002/0117756 A1 Aug. 29, 2002

(30) Foreign Application Priority Data

Feb. 28, 2001 (JP) ........................... 2001-053772

(51) Int. Cl.⁷ .................... H01L 23/48; H01L 23/52
(52) U.S. Cl. .................. 257/758; 257/773; 257/774
(58) Field of Search .................... 257/752, 758, 257/760, 762, 773, 774, 776, 781, 786; 438/618, 622, 626, 629, 631, 637, 639, 640

(56) References Cited

U.S. PATENT DOCUMENTS 5,602,423 A * 2/1997 Jain ........................ 257/752
6,100,589 A * 8/2000 Tanaka ..................... 257/758

FOREIGN PATENT DOCUMENTS

| JP | 06-318590 | 11/1994 |
|---|---|---|
| JP | 6-318590 | * 11/1994 |
| JP | 08-195393 | 7/1996 |
| JP | 09-008039 | 1/1997 |
| JP | 11-067763 | 3/1999 |
| JP | 11-162980 | 6/1999 |
| WO | WO 99/38204 | 7/1999 |

OTHER PUBLICATIONS

Japan Office Action dated Feb. 22, 2005 in English language Translation.

* cited by examiner

*Primary Examiner*—Hung Vu
(74) *Attorney, Agent, or Firm*—Westerman, Hattori, Daniels & Adrian, LLP

(57) ABSTRACT

A method for manufacturing a semiconductor device having flat pads. An opening and island-like dielectric films are first formed in a dielectric film. The opening is then filled with metal, and a metal layer is formed on the dielectric film. The upper surface of the metal layer is flattened using the CMP technique with the upper surface of the dielectric film functioning as a stopper. The island-like dielectric films prevent the occurrence of dishing in a conductive portion.

11 Claims, 6 Drawing Sheets

SEMICONDUCTOR DEVICE INCLUDING AN ISLAND-LIKE DIELECTRIC MEMBER EMBEDDED IN A CONDUCTIVE PATTERN

BACKGROUND OF THE INVENTION

The present invention relates to a semiconductor device and a method for manufacturing a semiconductor device. More particularly, the present invention relates to a semiconductor device having an external electrode terminal formed using the Damascene technique and a method for manufacturing such a semiconductor device.

Due to the increased integration, density, and speed of semiconductor devices, wiring that enables higher performance is desired. In the prior art, the material used for wiring is mainly aluminum. However, there is a tendency of electromigration occurring when using aluminum wires. Accordingly, copper has gathered attention as a material that has lower resistance than aluminum and resists electromigration. Copper wires contribute to increasing the speed of semiconductor devices and prolonging the life of semiconductor devices.

In the prior art, copper wires are manufactured using the Damascene technique. A groove is first formed in a dielectric film having a flat surface. The groove is then filled with a metal material. The metal material is then flattened so that the upper surface of the metal material becomes flush with the surface of the dielectric film. This manufactures metal wires. Accordingly, the Damascene technique is a relatively simple method for manufacturing metal wires and easily manufactures copper wires, which cannot be formed through dry etching.

In the prior art, a chemical mechanical polish (CMP) technique is used to flatten the metal material. The CMP technique is a process that combines etching and mechanical polishing and is optimal for flattening relatively large areas. A flattened semiconductor device is manufactured using the Damascene technique to form wires and using the CMP technique to flatten each layer of the semiconductor device.

Figure 1:
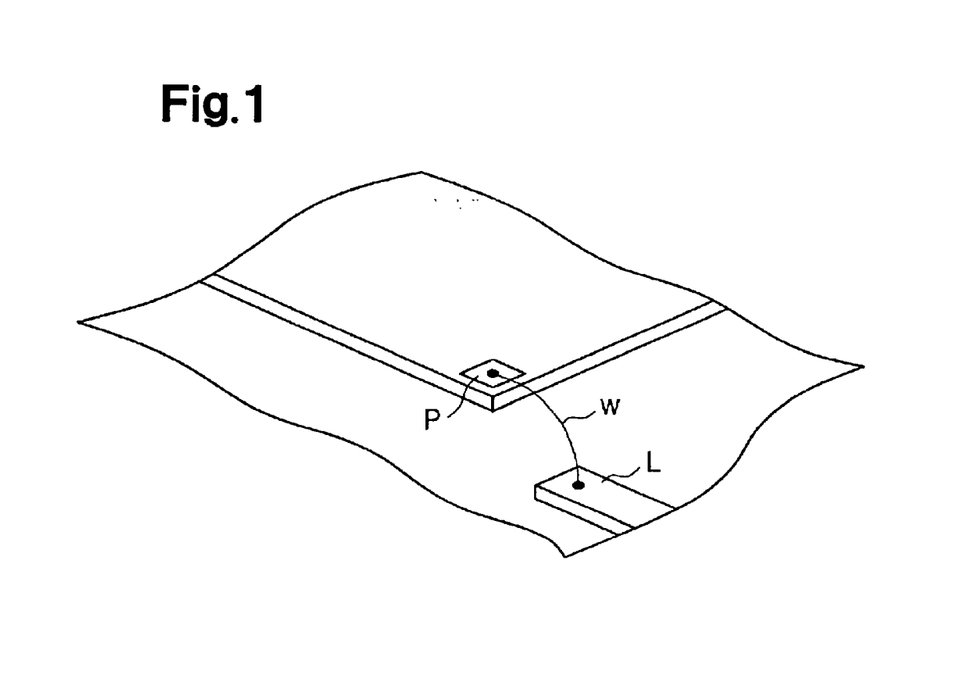
FIG. 1 is a schematic perspective view showing pad of a typical semiconductor device.

As shown in FIG. 1, in an integrated circuit of a semiconductor device, an external electrode terminal, such as pad P, is larger than other wires. It is thus difficult to form a flat pad P when using the CMP technique and the Damascene technique.

Figure 2:
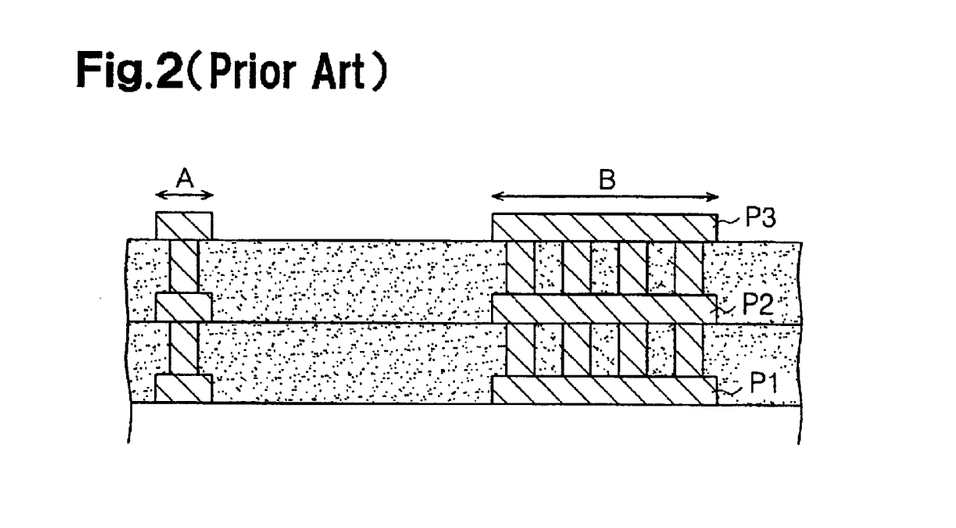
FIG. 2 is a schematic cross-sectional view showing a typical pad and an element of the prior art.

The pad P is an electrode for connecting a substrate, on which an integrated circuit is formed, to an external circuit. The pad P is connected to the external circuit by a wire w and a lead frame L. As shown in FIG. 2, the pad P includes a lower pad P1, an intermediate pad P2, and an upper pad P3. The size B of each of the pads P1, P2, P3 is larger than the size A of an element in the integrated circuit. In the actual semiconductor device, the size B of the pads P1, P2, P3 is several hundred times larger than the size A of the element.

The lower pad P1 and the intermediate pad P2 are not directly connected to the wire w but have the same size as the upper pad P3. This is to connect the upper pad P3 to the intermediate and lower pads P1, P2 in an aligned state and to test the contact between the semiconductor device and the external device with the lower and intermediate pads P1, P2 before forming an upper wiring layer.

A method for forming the relatively large pads P1, P2 using the Damascene technique at the same time as when forming an element region will now be discussed.

A groove formed in a dielectric film is first filled with a metal material of the pads P1, P2, P3. The upper surfaces of the pads P1, P2, P3 are then flattened using the CMP technique. However, the upper surface of the metal filled in the groove, which has a relatively large opened area, becomes lower than the surface of the dielectric film. This is a problem unique to the CMP technique and is referred to as dishing. Dishing decreases the flatness of the semiconductor device. Further, when the upper layer undergoes a lithography process, dishing may hinder focusing.

A prior art pad forming process and its shortcoming will now be discussed in more detail with reference to FIGS. 3a to 3g.

Figure 3A:
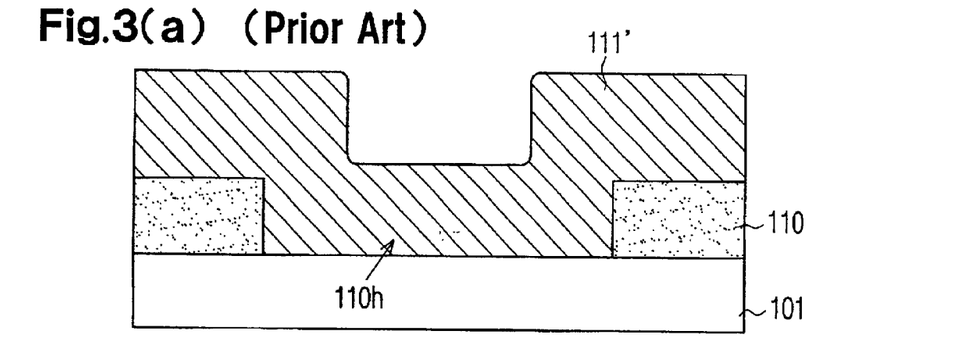
FIGS. 3a–3g are cross-sectional views illustrating a prior art process for manufacturing a semiconductor device.

Referring to FIG. 3a, in the prior art, a dielectric film 110 is first deposited on a substrate 101. A relatively large pad formation region 110h is formed in the dielectric film 110. Copper 111' is applied to the dielectric film 110 and the substrate 101 and filled in the pad formation region 110h.

Figure 3B:
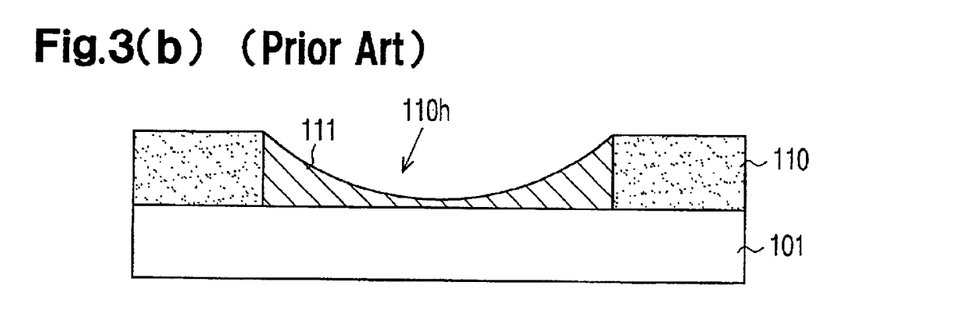

Then, the upper surface of the copper 111' is flattened using the CMP technique to form a pad 111 with the dielectric film 110 functioning as a stopper film. In this state, as shown in FIG. 3b, dishing occurs in the copper 111' in the pad formation region 110h, or the pad 111. Thus, the upper surface of the pad 111 is not flush with the upper surface of the dielectric film 110.

Further, when forming another layer on the pad 111 and the dielectric film 110 to manufacture a semiconductor device having a multilayer structure, dishing decreases the flatness of each layer.

Figure 3C:
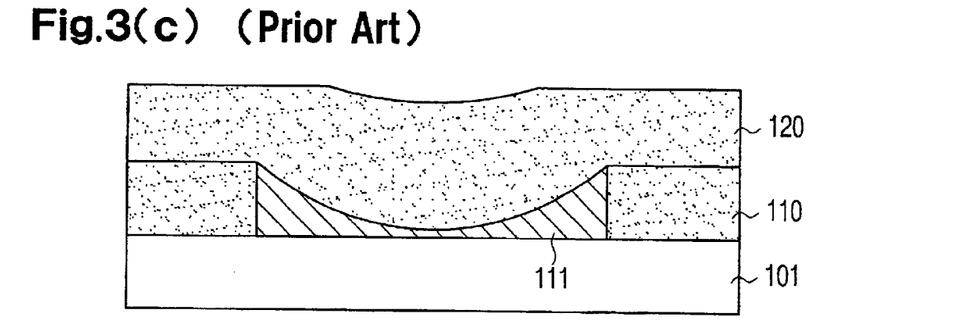
Figure 3D:
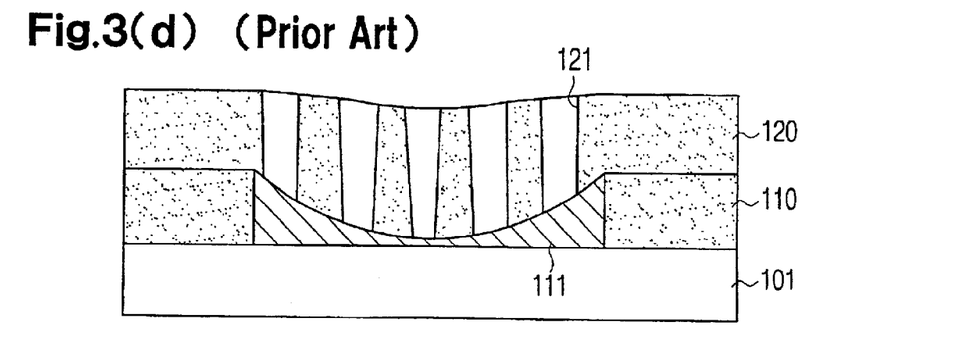
Figure 3E:
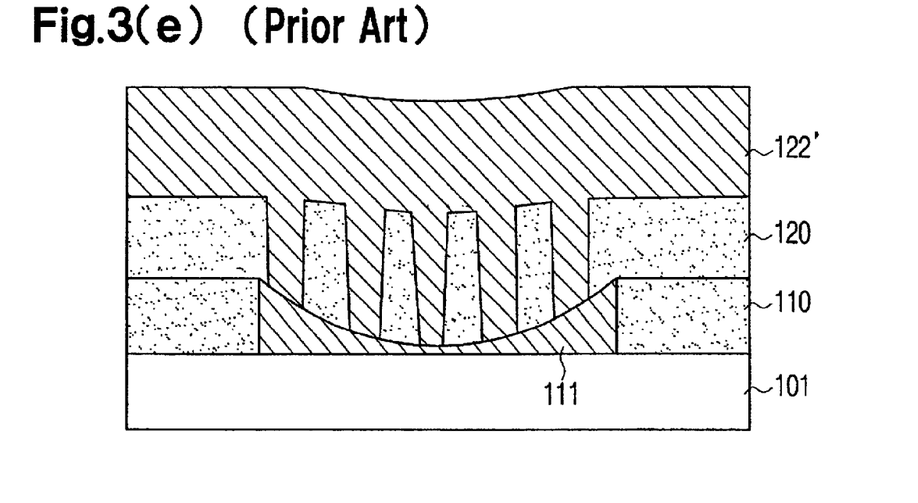
Figure 3F:
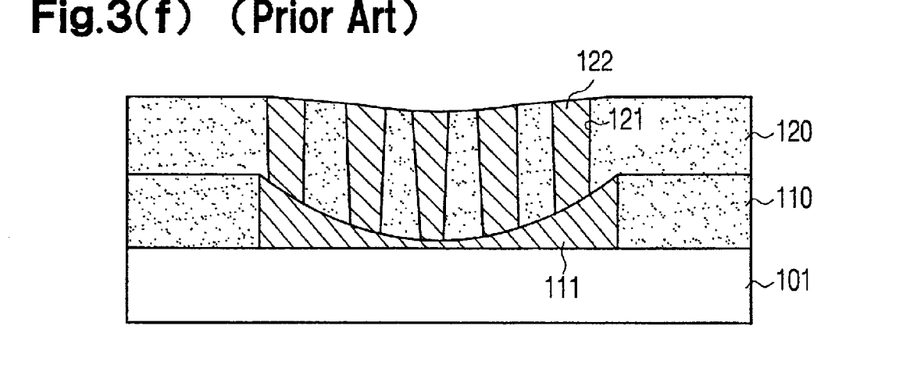
Figure 3G:
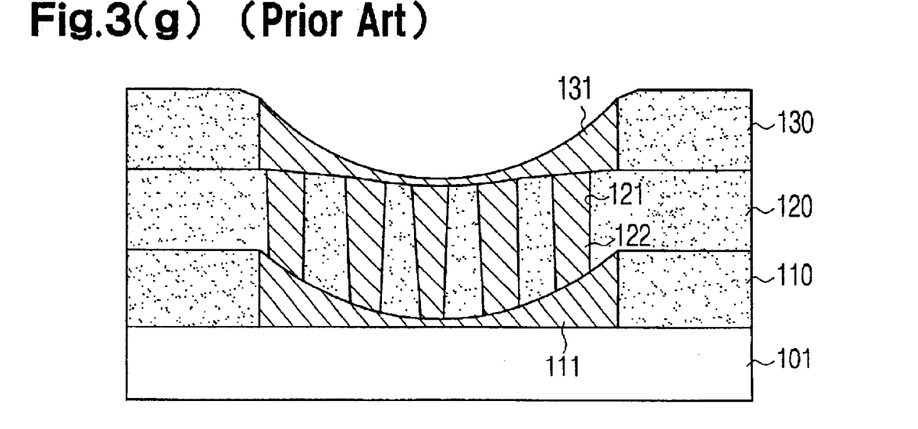

A process for manufacturing a semiconductor device having a multilayer structure will now be discussed with reference to FIGS. 3c to 3e. An interlayer dielectric film 120 is formed on the pad 111 and the dielectric film 110 (FIG. 3c). Contact holes 121 are then formed in the interlayer dielectric film 120 (FIG. 3d). A metal layer 122' is then applied to the interlayer dielectric film 120 so that the contact holes 121 are filled with metal, which is used to form plugs 122 (FIG. 3e). The metal layer 122' is etched to form the plugs (FIG. 3f). As shown in FIG. 3g, a pad 131, which is connected to the plugs 122, is formed. The lower layer pad 111 is connected to the upper layer pad 131 by the plugs 122.

Dishing also occurs when forming elements other than the pads 111, 131 using the Damascene technique. Thus, the flattening of a flat semiconductor device is difficult.

SUMMARY OF THE INVENTION

It is an object of the present invention to provide a method for manufacturing a semiconductor device having a flat surface using the Damascene technique and to provide a flat semiconductor device.

To achieve the above object, the present invention provides a semiconductor device that includes a semiconductor substrate. At least one dielectric film is arranged on the substrate and that dielectric film has an opening. A conductive portion fills the opening. At least one dielectric member is embedded in the conductive portion that fills the opening.

A further perspective of the present invention is a method for manufacturing a semiconductor device. The method includes forming an opening in a dielectric film arranged above the semiconductor substrate so as to leave a projection in the opening, filling the opening with a metal, and flattening the surface of the metal using the upper surface of the dielectric film as a stopper.

A further perspective of the present invention is a semiconductor device including a semiconductor substrate. At least one dielectric film is arranged on the substrate. The dielectric film includes an upper surface, a lower surface, and an opening. At least one dielectric member is arranged in the opening. A conductive portion fills the opening so as to surround the at least one dielectric member.

A further perspective of the present invention is a method for manufacturing a semiconductor device having a dielectric film arranged above a semiconductor substrate. The method includes forming an opening in the dielectric film so as to leave a projection in the opening by removing part of the dielectric film, filling the opening with a metal, and flattening the metal so that the upper surface of the dielectric film is flush with the upper surface of the metal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

A semiconductor device 100 according to a preferred embodiment of the present invention will now be discussed.

Figure 4:
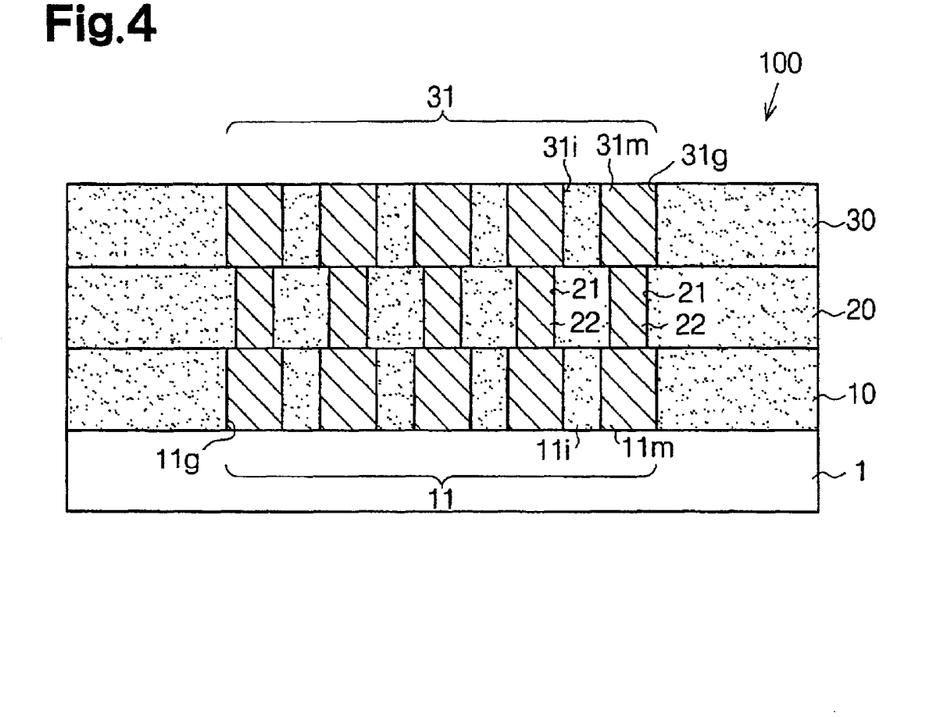
FIG. 4 is a cross-sectional view showing a semiconductor device according to a preferred embodiment of the present invention.

Referring to FIG. 4, the semiconductor device 100 includes a semiconductor substrate 1, insulation films or dielectric films 10, 20, 30, which are formed on the semiconductor substrate 1, and external electrode terminals, or pads 11, 31. The lower pads 11 are formed in the lower dielectric film 10 of the semiconductor substrate 1, and the upper pads 31 are formed in the upper dielectric film 30. The lower dielectric film 10 and the lower pad 11 define a lower wiring or dielectric layer, and the upper dielectric film 30 and the upper pad 31 define an upper wiring or dielectric layer. An interlayer dielectric film 20 is formed between the lower and upper wiring layers. Further, the interlayer dielectric film 20 has contact holes 21. A contact wire, or a plug 22, is arranged in each contact hole 21. The upper wiring layer, the lower wiring layer, and the interlayer dielectric film 20 are formed when other corresponding wiring layers (not shown) and interlayer dielectric films (not shown) of an integrated circuit in the semiconductor device 100 are formed.

Figure 5:
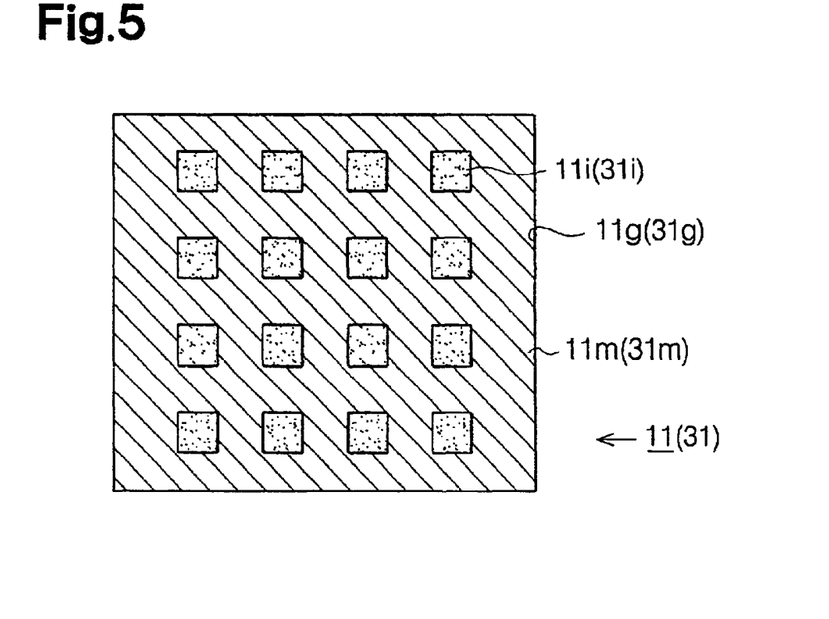
FIG. 5 is a plan view showing a pad of the semiconductor device of FIG. 4.

The lower and upper pads 11, 31 are formed in the lower and upper dielectric films 10, 30, respectively. With reference to FIG. 5, each lower pad 11 includes a metal conductive portion 11m and island-like dielectric films 11i, each of which are encompassed by the conductive portion 11m. The island-like dielectric films 11i are arranged in an opening 11g separated from one another. The height of each island-like dielectric film 11i, or each projection, is equal to the thickness of the lower wiring layer 10. In other words, the top end and bottom end of each island-like dielectric film 11i are respectively flush with the upper surface and lower surface of the lower wiring layer 10. The conductive portion 11m is formed using the Damascene technique. Although the lower pad 11 has the island-like dielectric films 11i, the conductive portion 11m is not divided by the island-like dielectric films 11i and thus conducts electricity. In other words, the island-like dielectric films 11i do not electrically disconnect parts of the conductive portion 11m from other parts of the conductive portion 11m.

The upper pad 31 has the same structure as that of the lower pad 11. That is, each upper pad 31 includes a conductive portion 31m, which is made of a metal such as copper, and island-like dielectric films 31i, which are arranged in the conductive portion 31m. The height of each island-like dielectric film 31i is equal to the thickness of the upper wiring layer 30. It is preferred that the area of the lower pad 11 and the upper pad 31 be substantially the same. This facilitates alignment and connection of the upper pad 31 with the lower pad 11.

The lower and upper pads 11, 31 have the island-like dielectric films 11i, 31i. This prevents dishing from occurring in the conductive portions 11m, 31m. Thus, the surfaces of the lower and upper pads 11, 31 are flattened when performing the CMP technique. Further, when performing the Dual Damascene technique to form a wiring layer of an integrated circuit in the semiconductor device 100, the pad 31 and contact holes 21 are simultaneously formed. Since the island-like dielectric films 11i, 31i prevent dishing from occurring, the semiconductor device 100 is manufactured with a flat surface.

The lower and upper pads 11, 31 are provided with dielectric members, or the island-like dielectric films 11i, 31i. Thus, the lower pad 11 and the upper pad 31 are connected together in an optimal manner. Further, wires that are connected to an external circuit are connected to the upper pad 31 in an optimal manner. More specifically, the plugs 22, which connect the conductive portion 11m of the lower pad 11 and the conductive portion 31m of the upper pad 31, electrically connect the lower and upper pads 11, 31. The area of the upper surfaces of the island-like dielectric films 11i is smaller than that of the contact area between the wire and the upper pads 31. Thus, the electric connection between the upper pad 31 and the wire is satisfactory.

When the structure of the upper pad 31 is the same as that of the lower pad 11, the lower wiring layer 10 may be tested before forming the interlayer dielectric film 20 through the lower pad 11 and a wire by an external testing apparatus (not shown).

A process for manufacturing the semiconductor device 100 of the preferred embodiment will now be discussed with reference to FIGS. 6a–6f. FIGS. 6a–6f show only the vicinity of the pads 11, 31 of the semiconductor device 100. It is preferred that the pads 11, 31 be formed in the same process as other wiring layers and interlayer dielectric films of the integrated circuit (not shown).

Figure 6A:
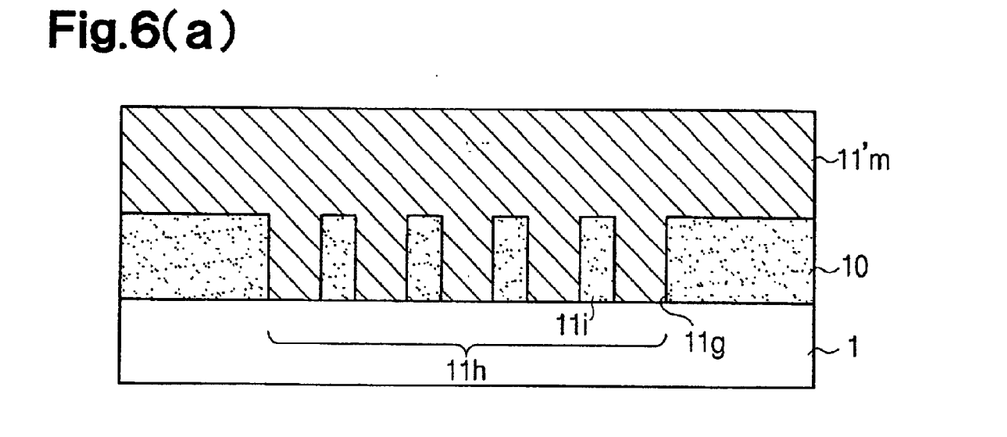
FIGS. 6a–6f are cross-sectional views illustrating a process for manufacturing the semiconductor device of FIG. 4.
Figure 6B:
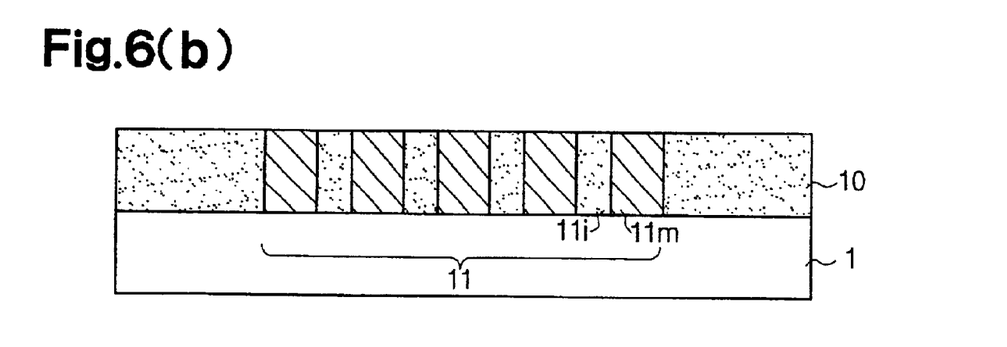

FIGS. 6a and 6b illustrate a process for manufacturing the lower pad 11 using the Damascene technique. More specifically, as shown in FIG. 6a, the lower dielectric film 10 is first formed on the substrate 1. The opening 11g is formed so that the island-like dielectric films 11i are left in the lower dielectric film 10. This defines a pad formation region 11h. A metal 11m' is applied to the substrate 1 and the dielectric film 10. This fills the opening 11g with the metal 11m'.

For example, copper, aluminum alloy, or tungsten may be used as the metal 11m'. The metal 11m' is applied to the substrate 1 and the dielectric film 10 by performing, for example, plating, high temperature sputtering, or the CVD process.

Then, the CMP technique is performed to flatten the upper surface of the metal 11m' using the upper surface of the lower dielectric film 10 as a stopper film. This forms the lower pad 11, which includes the conductive portion 11m and the island-like dielectric films 11i.

Figure 6C:
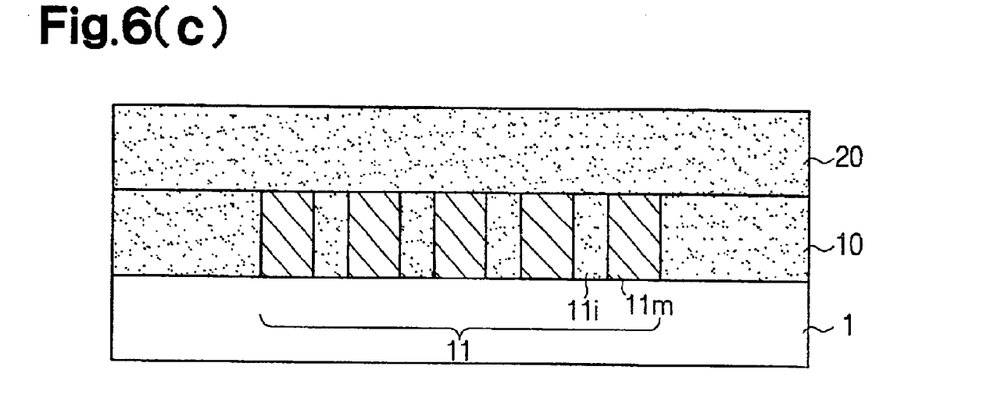
Figure 6D:
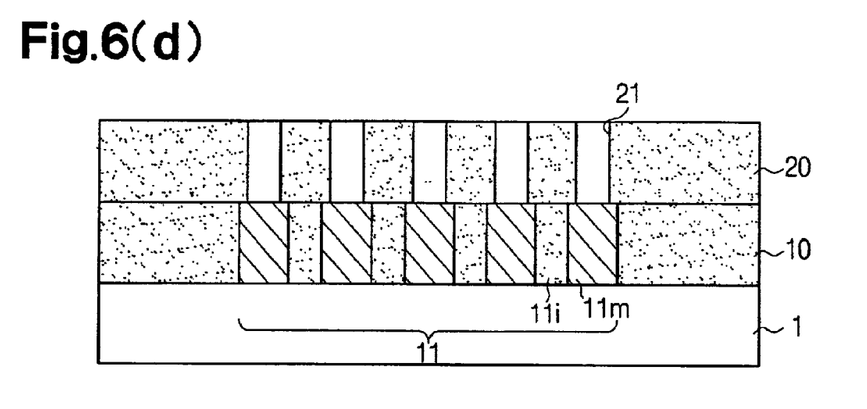
Figure 6E:
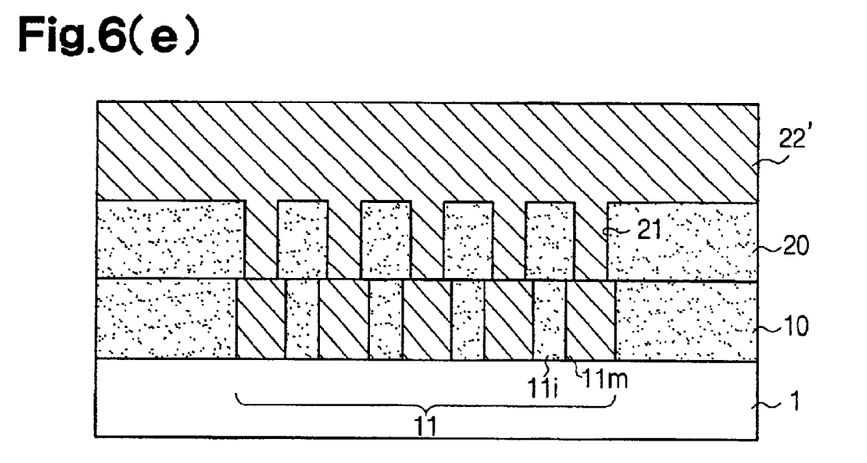

FIGS. 6c–6f illustrate a process for forming the plug 22 in the interlayer dielectric film 20 using the Damascene technique. Referring to FIG. 6c, the interlayer dielectric film 20 is formed on the lower dielectric film 10 and the lower pad 11. Referring to FIG. 6d, the contact holes 21 are formed in the interlayer dielectric film 20 at positions corresponding to the conductive portion 11m. Referring to FIG. 6e, a metal 22' is applied to the interlayer dielectric film 20 so that the contact holes 21 are filled with the metal 22'. Referring to FIG. 6e, the CMP technique is used to flatten the upper surface of the metal 22' with the interlayer dielectric film 20 functioning as a stopper. This forms the plugs 22 in the contact holes 21.

The same material as the metal 11m' of the lower layer may be used as the metal 22'. Further, the metal 22' may be applied to the interlayer dielectric film 20 in the same manner as when the metal 11m' is applied to the lower dielectric film 10.

Figure 6F:
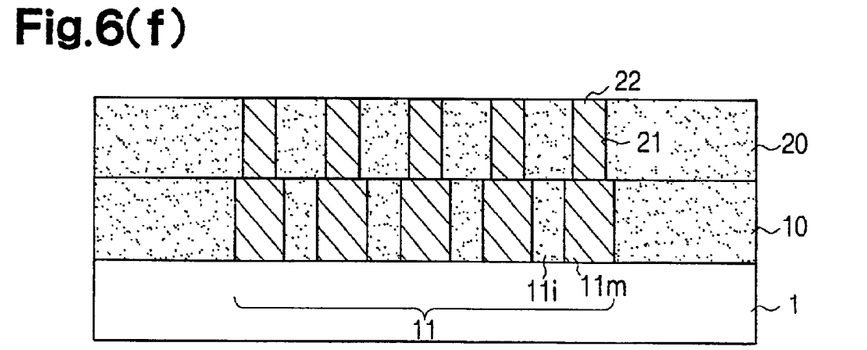

After forming the plugs 22, the upper dielectric film 30 and the upper pads 31 are formed on the interlayer dielectric film 20 and the plugs 22. The upper dielectric film 30 and the upper pad 31 are formed in the same manner as the lower dielectric film 10 and the lower pad 11.

In the present specification, electrodes and wires, such as the pads, define conductive bodies.

The preferred embodiment has the advantages described below.

(1) The island-like dielectric films 11i, 31i, which are formed in the pads 11, 31, prevent the occurrence of dishing in the conductive portions 11m, 31m, respectively. Further, the island-like dielectric films 11i, 31i are separated from one another in the corresponding pads 11, 31. Additionally, the conductive portions 11m, 31m are not divided by the corresponding island-like dielectric films 11i, 31i. Since the conductive portions 11m, 31m are each formed integrally, the reliability of the pads 11, 31 as a wire is maintained.

(2) The lower pads 11 and the upper pads 31 have substantially the same size. Thus, the lower and upper pads 11, 31 are easily aligned and connected to each other. Further, after forming the lower pad 11, an external testing apparatus may be connected to the lower pad 11 to test wire layers formed before the lower pad 11.

It should be apparent to those skilled in the art that the present invention may be embodied in many other specific forms without departing from the spirit or scope of the invention. Particularly, it should be understood that the present invention may be embodied in the following forms.

As long as the lower pads 11 can be connected to the upper pads 31, the lower pads 11 may be formed smaller than the upper pads 31 to prevent the occurring of dishing with the lower pads 11.

The island-like dielectric films 11i may be provided only for the lower pad 11. This prevents or suppresses the occurrence of dishing in the lower pad 11 and manufactures a relatively flat semiconductor device 100. When the island-like dielectric films 31i are not necessary, it is preferred that a process other than the Damascene technique be used to form the upper pad 31.

Each of the island-like dielectric films 11i, 31i do not have to have a square upper surface like in FIG. 5. For example, the island-like dielectric films 11i, 31i may each have a rectangular upper surface. In this case, the island-like dielectric films 11i, 31i are arranged in a stripe-like manner.

Instead of the island-like dielectric films 11i, 31i, at least one insulator or dielectric member having any shape, such as a cylindrical shape, may be formed in the openings 11g, 31g. This also avoids or suppresses the occurrence of dishing in the pads 11, 31. However, if the dielectric member in each conductive portion 11m, 31m divides part of the conductive portions 11m, 31m from other parts, the dielectric member would electrically disconnect the divided parts in each conductive portion 11m, 31m.

Instead of the semiconductor device 100, which has a plurality of wiring layers, the pads 11, 31 of the preferred embodiment and the method for manufacturing the pads 11, 31 may be applied to a semiconductor device having any number of layers including, a single-layer structure semiconductor device. All of the pads in the semiconductor device are not required to have the island-like dielectric films 11i, 31i. The island-like dielectric films 11i, 31i are formed only on pads that are fabricated using the Damascene technique.

The pads 11, 31 do not have to be formed when forming the wiring layers in the integrated circuit of the semiconductor device 100.

The application of the present invention is not limited to the formation of the pads 11, 31 and the plugs 22. The present invention may also be applied when forming wires and electrodes (conductive bodies) using the Damascene process. This also prevents or suppresses the occurrence of dishing in the wires and electrodes (conductive bodies). For example, a conductive portion, such as the conductive portion 11m of the pad 11, may be formed in lieu of the plugs 22. More specifically, an opening may be formed in the interlayer dielectric film 20 leaving at least one insulator, or dielectric projection, in the opening. The size of the opening is substantially the same as that of the lower pad 11 and the upper pad 31. The opening is filled with metal to connect the lower pad 11 and the upper pad 31.

The present examples and embodiments are to be considered as illustrative and not restrictive, and the invention is not to be limited to the details given herein, but may be modified within the scope and equivalence of the appended claims.

What is claimed is:

1. A semiconductor device having a multilayer wiring structure, comprising:

a semiconductor substrate;

a lower dielectric layer arranged on and in direct contact with the substrate and having an opening, a lower conductive portion filling the opening, and at least one dielectric member embedded in the lower conductive portion;

an interlayer dielectric film arranged on the lower dielectric layer and having a contact wiring; and an upper dielectric layer arranged on the interlayer dielectric film and having an upper opening, an upper conductive portion filling the upper opening, and at least one dielectric member embedded in the upper conductive portion, wherein the upper conductive portion and the lower conductive portion are electrically connected by the contact wiring.

2. The semiconductor device according to claim 1, wherein at least one dielectric member is arranged in an island-like manner in the opening.

3. The semiconductor device according to claim 1, wherein the upper conductive portion includes an external electrode terminal.

4. A semiconductor device having a multilayer wiring structure, comprising:

a semiconductor substrate;

a lower dielectric layer arranged on and in direct contact with the substrate and including an upper surface, a lower surface, an opening, at least one first dielectric member arranged in the opening, and a lower conductive portion filling the opening so as to surround the at least one first dielectric member;

an interlayer dielectric film arranged on the lower dielectric layer and having a contact wiring; and an upper dielectric layer arranged on the interlayer dielectric film and having an upper opening, at least one second dielectric member arranged in the upper opening, and an upper conductive portion filling the upper opening so as to surround the at least one second dielectric member, wherein the upper conductive portion and the lower conductive portion are electrically connected by the contact wiring.

5. The semiconductor device according to claim 4, wherein the at least one first dielectric member has a height that is the same as the thickness of the lower dielectric layer.

6. The semiconductor device according to claim 4, wherein the at least one first dielectric member has an end flush with the upper surface of the lower dielectric layer and a further end flush with the lower surface of the lower dielectric layer.

7. The semiconductor device according to claim 4, wherein the at least one first dielectric member is one of a plurality of separated dielectric members.

8. The semiconductor device according to claim 4, wherein the lower conductive portion has a flat surface flush with the upper surface of the lower dielectric layer.

9. A semiconductor device comprising:

a semiconductor substrate;

a lower dielectric layer arranged on and in direct contact with the semiconductor substrate and having a lower pad, wherein the lower pad includes a lower through hole, a lower conductive metal filling the lower through hole, and at least one dielectric member enclosed by the conductive metal;

an interlayer dielectric film arranged on the lower dielectric layer and having a contact wiring; and an upper dielectric layer arranged on the interlayer dielectric film having an upper pad, wherein the upper pad includes an upper through hole, an upper conductive metal filling the upper through hole, and at least one second dielectric member enclosed by the upper conductive metal, and wherein the upper conductive metal is electrically connected to the lower conductive metal via the contact wiring of the interlayer dielectric film.

10. The semiconductor device according to claim 9, wherein the lower conductive portion and the upper conductive portion are arranged vertically.

11. The semiconductor device according to claim 10, wherein the contact wiring of the interlayer dielectric film includes a through hole, a conductive metal filling the through hole, and at least one dielectric member enclosed by the conductive metal.

* * * * *